(12) United States Patent
Maeng et al.

(10) Patent No.: US 8,822,338 B2
(45) Date of Patent: Sep. 2, 2014

(54) CVD APPARATUS AND METHOD OF FORMING SEMICONDUCTOR SUPERLATTICE STRUCTURE USING THE SAME

(75) Inventors: Jong Sun Maeng, Gwangju (KR); Ki Sung Kim, Gyunggi-do (KR); Bum Joon Kim, Seoul (KR); Suk Ho Yoon, Seoul (KR); Hyun Seok Ryu, Gyunggi-do (KR); Sung Tae Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 264 days.

(21) Appl. No.: 13/276,729

(22) Filed: Oct. 19, 2011

(65) Prior Publication Data
US 2012/0171815 A1    Jul. 5, 2012

(30) Foreign Application Priority Data

Jan. 4, 2011 (KR) .................... 10-2011-0000535

(51) Int. Cl.
*H01L 21/44* (2006.01)
(52) U.S. Cl.
USPC ............... 438/680; 118/715; 257/E21.17

(58) Field of Classification Search
USPC .................... 438/680, 681; 118/715, 725; 257/E21.17
See application file for complete search history.

(56) References Cited

U.S. PATENT DOCUMENTS 8,304,328 B2 * 11/2012 Maeda et al. ............ 438/482

FOREIGN PATENT DOCUMENTS

KR  10-2006-0056567 A  5/2006

* cited by examiner

*Primary Examiner* — Quoc Hoang
(74) *Attorney, Agent, or Firm* — McDermott Will & Emery LLP

(57) ABSTRACT

Provided is a chemical vapor deposition (CVD) apparatus, including: a reaction chamber including an inner pipe having an internal space, and an external pipe configured to cover the inner pipe so as to maintain a sealing state thereof; a wafer holder disposed within the inner pipe and receiving a plurality of wafers stacked therein; and a gas supplier including at least one stem pipe disposed at the outside of the reaction chamber so as to supply a reactive gas thereto, a plurality of branch pipes connected to the stem pipe to introduce the reactive gas from the outside of the reaction chamber into the reaction chamber, and a plurality of spray nozzles provided with the branch pipes to spray the reactive gas to the plurality of respective wafers.

14 Claims, 17 Drawing Sheets

(a)

(b)

CVD APPARATUS AND METHOD OF FORMING SEMICONDUCTOR SUPERLATTICE STRUCTURE USING THE SAME

CROSS-REFERENCE TO RELATED APPLICATIONS

This application claims the priority of Korean Patent Application No. 10-2011-0000535 filed on Jan. 4, 2011, in the Korean Intellectual Property Office, the disclosure of which is incorporated herein by reference.

BACKGROUND OF THE INVENTION

1. Field of the Invention

The present invention relates to a chemical vapor deposition (CVD) apparatus and a method of forming a semiconductor superlattice structure using the same, and more particularly, to a CVD apparatus able to allow thin films to be grown on both surfaces of a substrate by using a metal organic compound, and a method of forming a semiconductor superlattice structure using the same.

2. Description of the Related Art

Demand for nitride-based (GaAlInN) light emitting devices (LEDs) has greatly increased in the fields of various electronic products including a mobile phone keypad, an LCD screen backlighting unit, a TV backlighting unit (BLU) and a general illumination system. In order to satisfy this demand, research into the introduction of a large-diameter sapphire wafer, for example, using a 6-inch sapphire wafer in the place of a 4-inch sapphire wafer, or the like, has been conducted, the sapphire wafer being used in the process in which a nitride or oxide semiconductor (for example, GaN, ZnO) applicable to a light emitting device is grown to have a superlattice structure.

The present chemical vapor deposition method is performed at the level of production to allow approximately 10 4 inch sapphire wafers of to be grown at a time. However, there is a limit to the generation of mass due to a structural characteristic of a susceptor supporting the sapphire wafer.

Furthermore, when a reactive gas is supplied to a reaction chamber through a gas supplier, the gas supplier may become blocked due to an early decomposition of the reactive gas, and a semiconductor layer may not be uniformly deposited on every wafer.

SUMMARY OF INVENTION

An aspect of the present invention provides a chemical vapor deposition (CVD) apparatus capable of preventing a reactive gas from being deposited inside a gas supplier under a high temperature atmosphere and the gas supplier from being blocked due to the deposition of the reactive gas.

Another aspect of the present invention provides a CVD apparatus having an improved vacuum and mechanical stability by manufacturing a gas supplier to be integrated therewith.

According to an aspect of the present invention, there is provided a CVD apparatus including: a reaction chamber including an inner pipe having an internal space, and an external pipe configured to cover the inner pipe so as to maintain a sealing state thereof; a wafer holder disposed within the inner pipe and receiving a plurality of wafers stacked therein; and a gas supplier including at least one stem pipe disposed at the outside of the reaction chamber so as to supply a reactive gas, a plurality of branch pipes connected to the stem pipe to introduce the reactive gas from the outside of the reaction chamber into the reaction chamber, and a plurality of spray nozzles provided with the branch pipes to spray the reactive gas to the plurality of respective wafers.

The CVD apparatus may further include a heater disposed at the outside of the reaction chamber and configured to be separable therefrom, the heater being for heating the reaction chamber.

The heater may be configured to have an insertion hole and a fastening aperture, into which the stem pipe is inserted, and the heater may be configured to be fastened to or separated from the reaction chamber by being inserted into the insertion hole thereof and vice versa.

The stem pipe may be configured to extend vertically so as to correspond to a stacking direction of the wafers.

The plurality of spray nozzles may be arrayed to correspond to intervals between stacked wafers so as to be opposed to respective side circumferential parts of the stacked wafers.

The plurality of spray nozzles may be arrayed to be located between the stacked wafers.

The gas supplier may include a plurality of stem pipes supplying different reactive gases.

The gas supplier may further include a ring shaped pipe, the ring shaped pipe being connected through the stem pipe, formed to have a circular ring shape having a diameter larger than that of the wafer so as to surround a circumference of the wafer, and being configured to have a plurality of spray nozzles disposed in a circumferential part of the circular ring shape.

The ring shaped pipe may be configured to have a multi-pipe structure such that different reactive gases may be supplied to the wafers therethrough.

The CVD apparatus may further include a guide part provided to guide a flow of the reactive gas such that the reactive gas sprayed from the spray nozzles is sprayed to and flows on top and bottom surfaces of each wafer.

The guide part may be disposed between the spray nozzle and the wafer and configured to include an upper sloped face and a lower slope face, the upper sloped face and the lower sloped face being formed to respectively slope from the wafer toward the spray nozzle such that respective sections in the guide part are provided to be reduced in size, and being formed to meet at an end point thereof.

The guide parts maybe vertically arrayed in a stacking direction of the wafers and arrayed to correspond to intervals between the stacked wafers so as to be opposed to each side part of the stacked wafers.

The guide parts maybe vertically arrayed to correspond to intervals between the stacked wafers so as to be opposed to a gap between the stacked wafers.

The guide parts may be formed to extend from the wafer holder toward the spray nozzles and vertically arrayed along a stacking direction of the wafers.

According to another aspect of the present invention, there is provided a method of forming a semiconductor superlattice structure, the method comprising: stacking and mounting a plurality of wafers to be spaced apart from one another in a wafer holder, and disposing the wafer holder within an inner pipe of a reaction chamber, the reaction chamber including the inner pipe having an internal space, and an external pipe configured to cover the inner pipe so as to maintain a sealing state thereof; spraying a reactive gas from the outside to the wafers through a gas supplier, the gas supplier including at least one stem pipe configured to extend vertically so as to correspond to a stacking direction of the wafers and disposed at the outside of the reaction chamber, a plurality of branch pipes connected to the stem pipe to introduce the reactive gas from the outside of the reaction chamber into the reaction chamber, and a plurality of spray nozzles provided with the branch pipes; and allowing the reactive gas sprayed from the gas supplier to flow along surfaces of each wafer so as to allow the semiconductor superlattice structure to be grown on the surfaces of the respective wafers.

The method may further include disposing a heater at the outside of the reaction chamber after the disposing of the wafer holder within the inner pipe so as to heat the reaction chamber.

In the case of the gas supplier, a single gas supplier or a plurality of gas suppliers may be configured to supply the same reactive gas or different reactive gases to be respectively distinguished.

BRIEF DESCRIPTION OF DRAWINGS

The above and other aspects, features and other advantages of the present invention will be more clearly understood from the following detailed description taken in conjunction with the accompanying drawings, in which.

DETAILED DESCRIPTION OF PREFERRED EMBODIMENT

Figure 1:
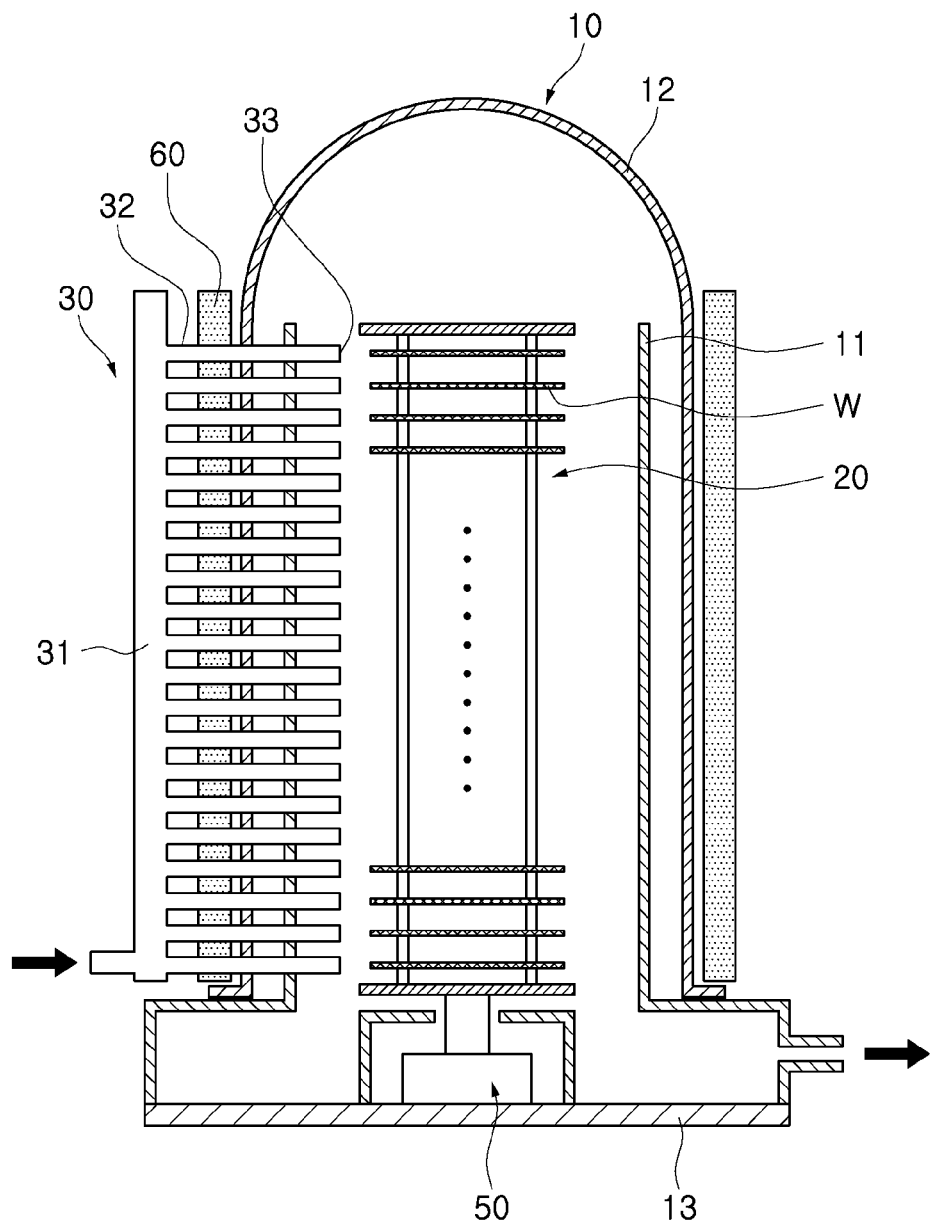
FIG. 1 is a cross-sectional view of a CVD apparatus according to an embodiment of the present invention.

Exemplary embodiments of the present invention will now be described in detail with reference to the accompanying drawings such that they could be easily practiced by those having skill in the art to which the present invention pertains. However, in describing the exemplary embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of any other elements.

According to an embodiment of the present invention, a chemical vapor deposition (CVD) apparatus will be described with reference to FIGS. 1 to 5.

Figure 2:
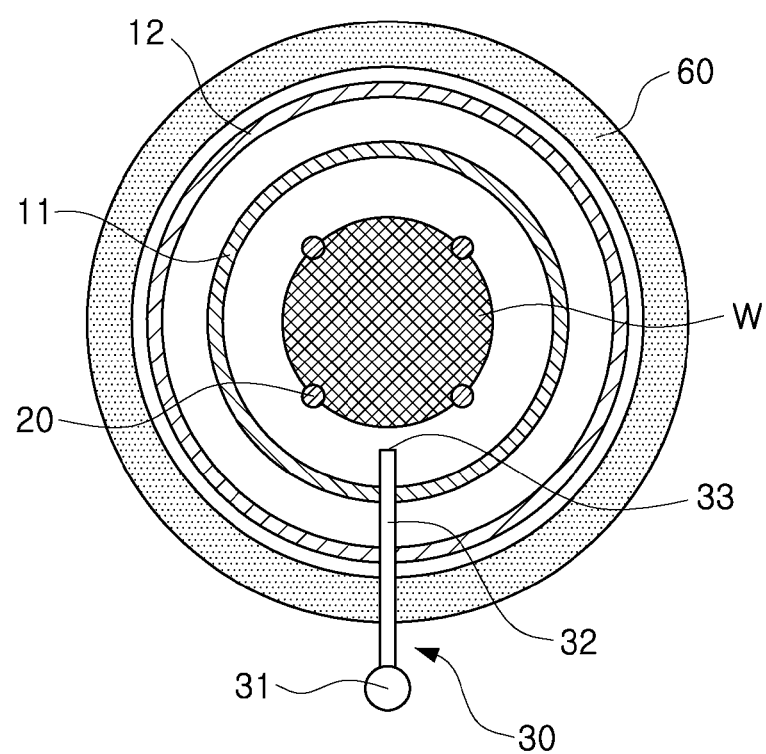
FIG. 2 is a plan view of the CVD apparatus shown in FIG. 1.
Figure 3:
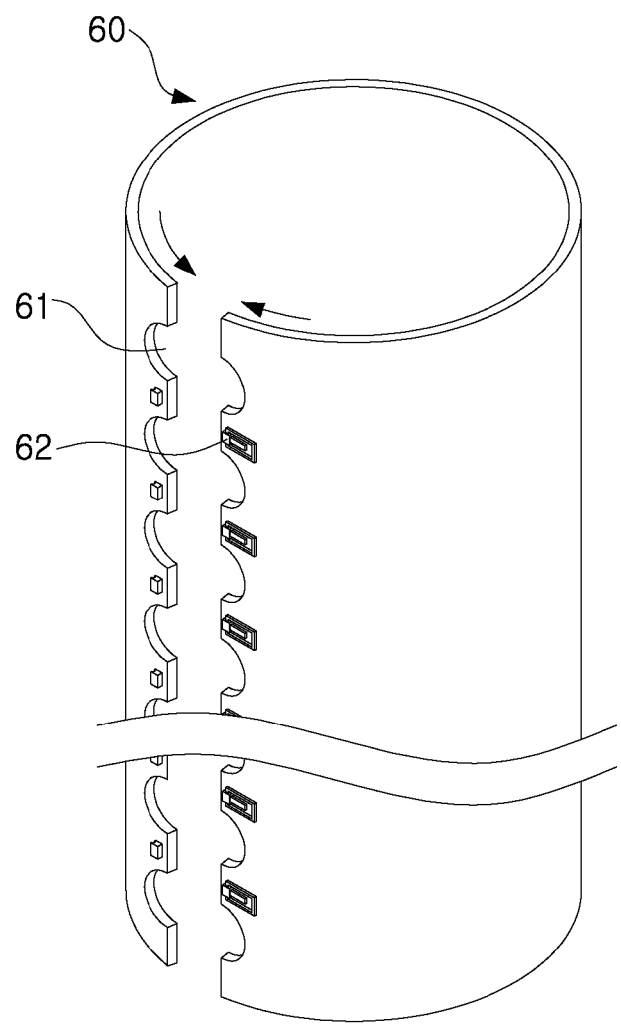
FIG. 3 is a schematic perspective view of a heater referred to in FIG. 1.
Figure 4:
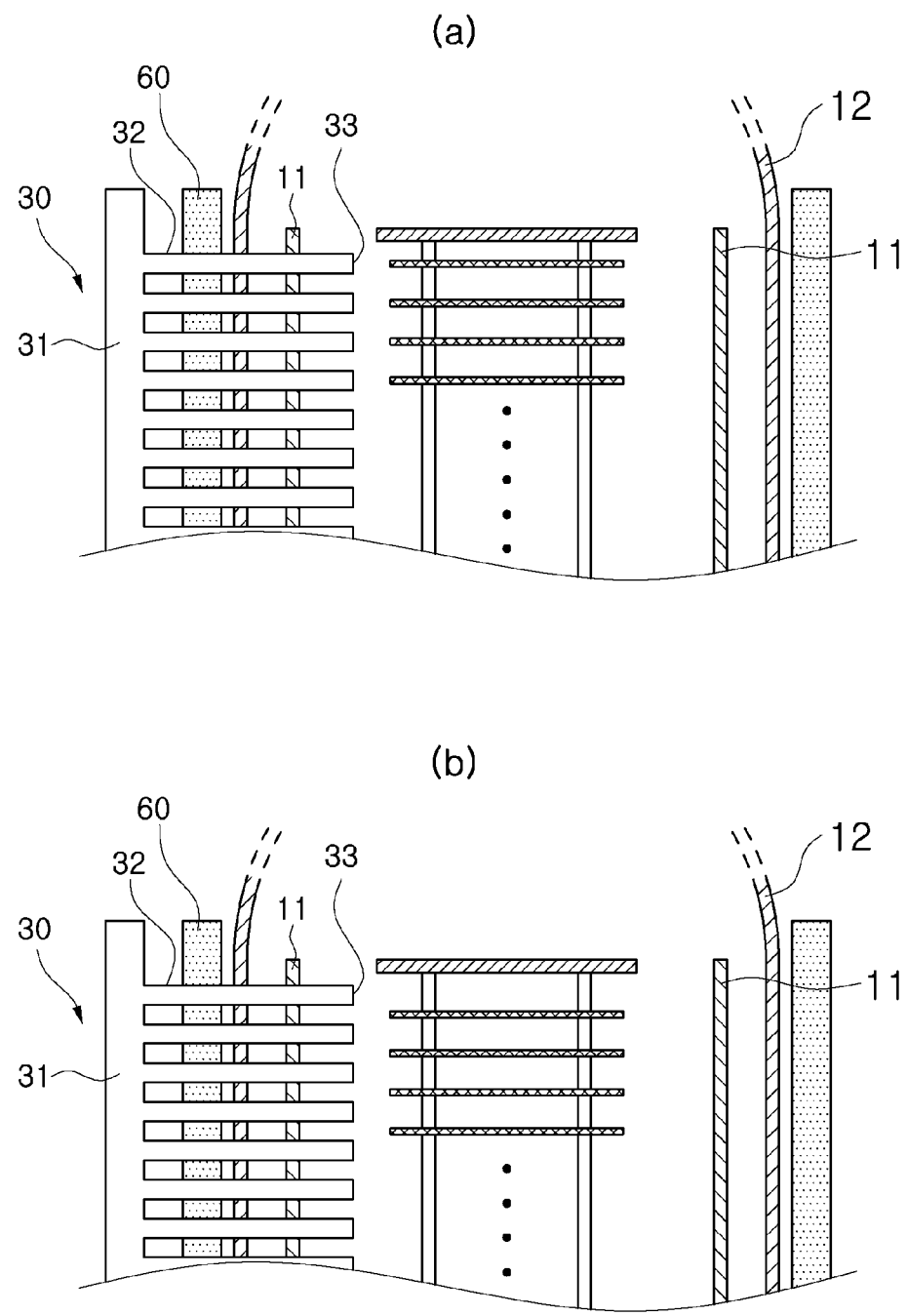
FIG. 4 is cross-sectional views illustrating a position on which spray nozzles of a gas supplier are disposed to correspond to respective stacked wafers according to an embodiment of the present invention.
Figure 5:
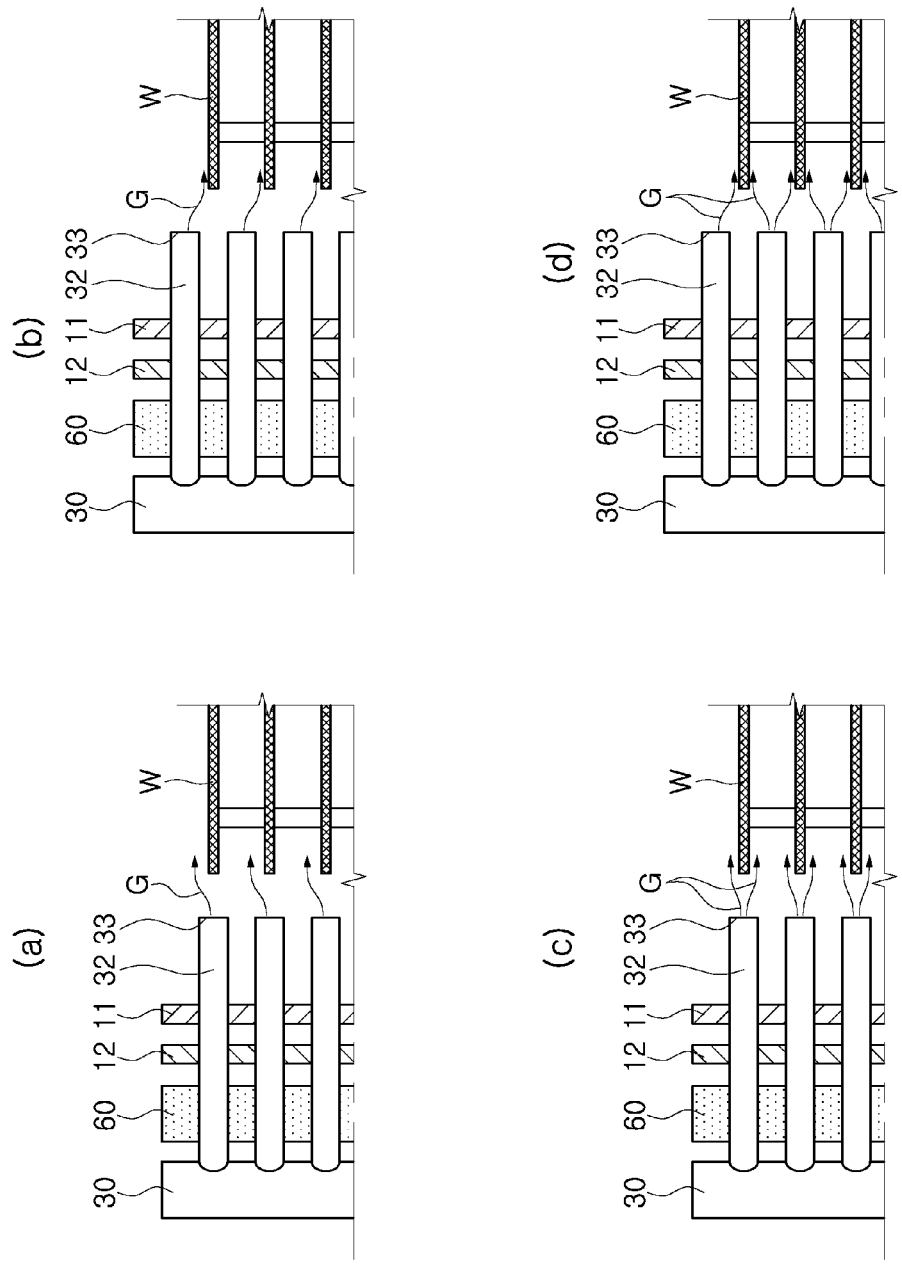
FIG. 5 is cross-sectional views illustrating the principle of a deposition in which thin films are deposited on surfaces of respective wafers using a gas supplier according to an embodiment of the present invention.

FIG. 1 is a cross-sectional view of a CVD apparatus according to an embodiment of the present invention, and FIG. 2 is a plan view of the CVD apparatus shown in FIG. 1. FIG. 3 is a schematic perspective view of a heater depicted in FIG. 1. FIG. 4 is cross-sectional views illustrating a position on which spray nozzles of a gas supplier configured to respectively correspond to stacked wafers are disposed according to the embodiment of the present invention, and FIG. 5 is cross-sectional views illustrating the principle of a deposition process in which thin films are deposited on surfaces of respective wafers using a gas supplier according to the embodiment of the present invention.

Referring to FIGS. 1 and 2, a CVD apparatus 1 according to an embodiment of the present invention may include a reaction chamber 10, a wafer holder 20 and a gas supplier 30. The CVD apparatus 1 may further include a rotation driving unit 50 connected to the wafer holder 20 to rotate the wafer holder 20. The CVD apparatus 1 may further include a heater 60 installed around the reaction chamber 10 to heat the inside of the reaction chamber 10. By this use of the heater 60, relatively high temperature uniformity in the reaction chamber 10 may be maintained.

The reaction chamber 10 may be configured to have a double structure including an inner pipe 11 and an external pipe 12. The inner pipe 11 of the reaction chamber 10 may be cylindrical and have opened upper and lower parts, and may be configured to have an internal space of a predetermined size. The external pipe 12 of the reaction chamber 10 maybe configured to have an opened lower structure and cover the inner pipe 11 so as to maintain a sealing state of the inner pipe 11. In addition, the inner pipe 11 may be provided with a base plate 13 disposed on the lower part of the inner pipe 11. The base plate 13 may be disposed at a lower part of the inner pipe 11 to open or close the inner pipe 11. The inner pipe 11, the external pipe 12 and the base plate 13 may be formed of quartz or SiC.

In the case of the wafer holder 20, a plurality of wafers W for a thin film growth process may be stacked to be spaced apart from one another at predetermined intervals. The wafer holder 20 in which the wafers W are stacked may be disposed within the inner pipe 11, or discharged to the outside, by the base plate 13 to open or close the inner pipe. The wafer holder 20 may be formed of a material such as quartz or the like so as to prevent the wafer holder 20 from being transformed within the reaction chamber 10 having a high-temperature and high pressure atmosphere, but is not limited thereto.

As such, hundreds of wafers W may be stacked so as to be spaced apart from one another at predetermined intervals in the wafer holder 20, thereby allowing for the mass production of the thin-film growth process on wafers, as compared with a related art in which only several wafers W may be stacked on a susceptor so as to have thin films grown thereon.

The wafer holder 20 may be configured to be connected to the rotation driving unit 50 protected by a heat insulating plate so as to rotate at a predetermined speed by a rotation force applied from the rotation driving unit 50 within the inner pipe 11. Therefore, a superlattice structure 80 may be uniformly grown on the entire surface of the wafer W.

The gas supplier 30 may be configured to include at least one stem pipe 31 disposed at the outside of the reaction chamber; a plurality of branch pipes 32 connected to the stem pipe 31 to introduce the reactive gas into the reaction chamber 10 from the outside of the reaction chamber 10; and a plurality of spray nozzles 33 provided with the branch pipes 32 to spray the reactive gas to the respective wafers W. That is, the gas supplier 30 may supply the reactive gas from the stem pipe 31 to the branch pipes 32 and then spray the reactive gas to the respective wafers through the spray nozzles 33 in order to allow a semiconductor superlattice structure to be grown on the surfaces of the wafers W. In detail, the stem pipe 31 may be formed to vertically extend so as to correspond to a stacking direction of the wafers W at the outside of the reaction chamber, such that the reactive gas is introduced from the outside of the reaction chamber into the reaction chamber to spray the reactive gas to the wafers in the high temperature reaction chamber, thereby spraying the reactive gas to the reaction chamber through a relatively reduced channel path by applying the stem pipe 31 thereto. Therefore, the reactive gas G may be prevented from reacting with and being deposited on the inside of the gas supplier 30 on the way in which the reactive gas is being supplied from the gas supplier 30 to the reaction chamber 10 under the high temperature atmosphere.

The reactive gas G may be used as, for example, an alloy of a nitride semiconductor (Ga(Al, In)N) and a doping source, and may contain TMGa, TEGa, TMIn, TMAl, $SiH_4$, $Cp_2Mg$, DEZn, $NH_3$, $H_2$, $N_2$, or the like. Also, the reactive gas G may be used as, for example, an alloy of an oxide semiconductor (Zn(Cd, Mg)O) and a doping source, and may contain DEZn, TMGa, TEGa, TMIn, TMAl, $Cd[(EPiPr_2)_2N]_2$ (E=S, Se), TMSb, $Cp_2Mg$, $N_2$, Ar, $O_2$, $N_2O$, $O_3$, or the like.

The spray nozzles 33 may be respectively disposed at ends of the respective branch pipes 32 to correspond to positions on which the respective wafers W are disposed, and maybe formed to be respectively connected through the stem pipe 31.

FIG. 3 is a schematic perspective view of a heater 60 disposed outside the reaction chamber. Referring to FIG. 3, the heater may include an insertion hole 61 and a fastening aperture 62.

The insertion hole through which the branch pipes from the stem pipe of the gas supplier disposed at the outside of the heater are inserted into the reaction chamber may be provided. The heater may be formed to have a jacket shape to be able to be fastened to or separated from the reaction chamber by being inserted into the insertion hole thereof and vice versa.

The fastening aperture may be provided to stably fasten the heater to the reaction chamber. Though not shown in the drawings, the heater may further include a heating wire and a controller controlling an amount of current flowing through the heating wire.

As shown in FIG. 4A, the plurality of spray nozzles 33 may be arrayed to correspond to intervals between the stacked wafers W, and disposed to be opposed to the circumferences, side parts of the stacked wafers W. As shown in FIG. 4B, the plurality of spray nozzles 33 may be also arrayed to be located between the wafer W and wafer W which are stacked with each other. By this structure, the spray nozzles 33 may respectively spray the reactive gas G to the surfaces of the wafers W so as to form the superlattice structure 80 on the surfaces of the respective wafers W.

In detail, as shown in FIGS. 5A and 5B, the spray nozzles 33 may spray the reactive gas G to one surface of each wafer W, a top surface of a wafer, to form the superlattice structure 80 on only the top surface of the wafer W. In addition, as shown in FIGS. 5C and 5D, the reactive gas G may be also sprayed to top and bottom surfaces of each wafer W so as to simultaneously form the superlattice structure 80 on the top and bottom surfaces of each wafer W. That is, the plurality of spray nozzles 33 maybe disposed to correspond to positions on which the respective wafers W are stacked to supply the reactive gas G such that the reactive gas G flows on the top and bottom surfaces of the respective wafers W, thereby allowing the superlattice structure 80 to be grown on both of top and bottom surfaces of the respective wafers W.

As such, when the superlattice structure 80 is formed on the top and bottom surfaces of the wafer W, a light emitting structure 80' configured of two superlattice structures may be obtained from a single wafer W, thereby improving productivity to achieve the mass production.

This growth of the superlattice structure 80 on both surfaces of the wafer W may prevent the wafer W from being transformed due to stress (f). In case in which the superlattice structure 80 is grown on only one surface of the wafer W in the manner similar to a CVD apparatus according to the related art, a relatively strong stress (f) may act upon the superlattice structure to generate a bowing effect which is a factor in forming a concave in the surface of the wafer. This effect may be more severe when large-diameter wafers are used, such that the wafer may be damaged due to degradation in the performance thereof or the like. However, according to an embodiment of the present invention, the superlattice structure 80 may be grown on both surfaces of the wafer W, and thus, the stress (f) generated on top and lower surfaces of the wafer W may be reduced, thereby removing a factor in the formation of defects according to the related art. In particular, the large-diameter wafers W can be used without the occurrence of defects, thereby improving productivity.

Figure 6:
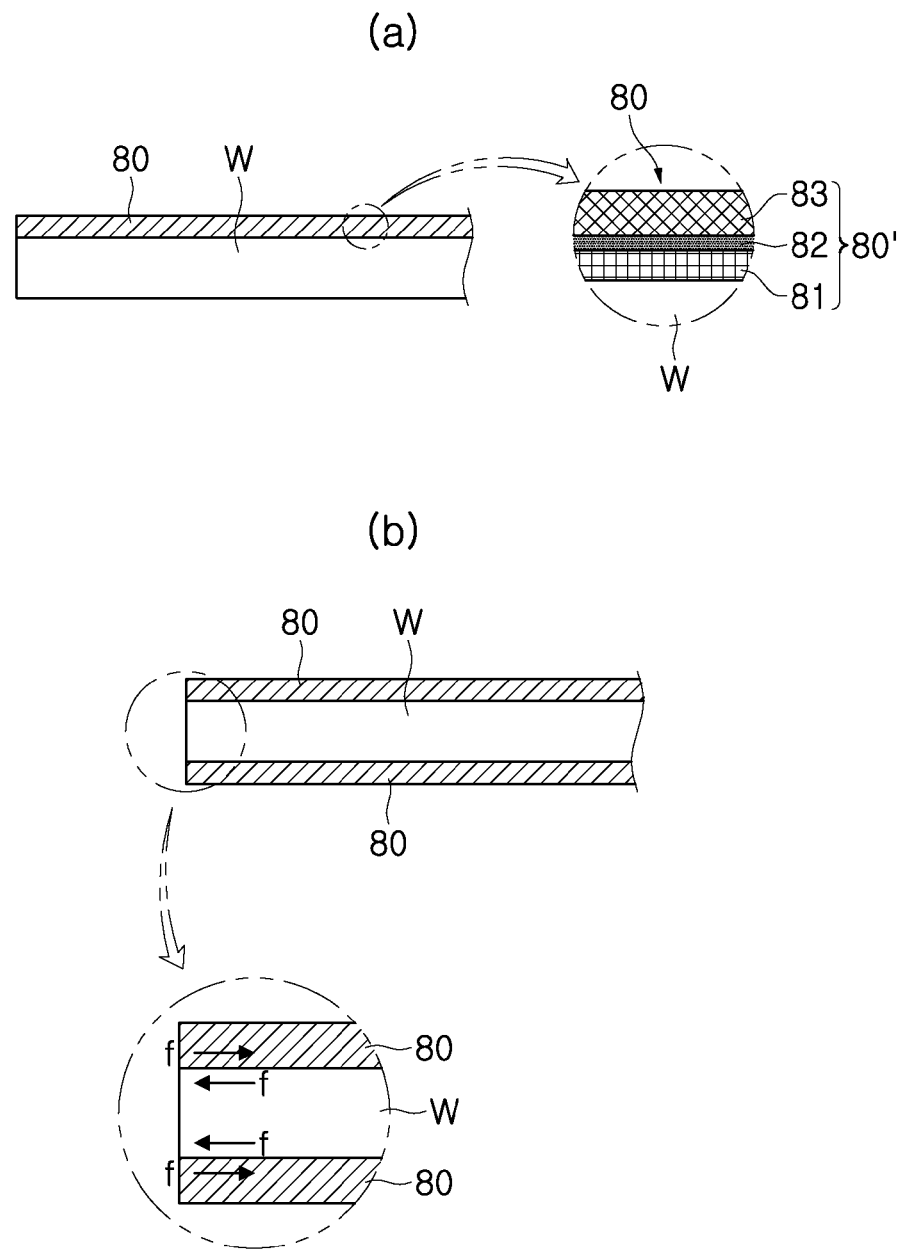
FIG. 6 is cross-sectional views illustrating a growth state of each thin film on a top surface of wafer, or a top surface and a bottom surface of the wafer shown in FIG. 5.
Figure 7:
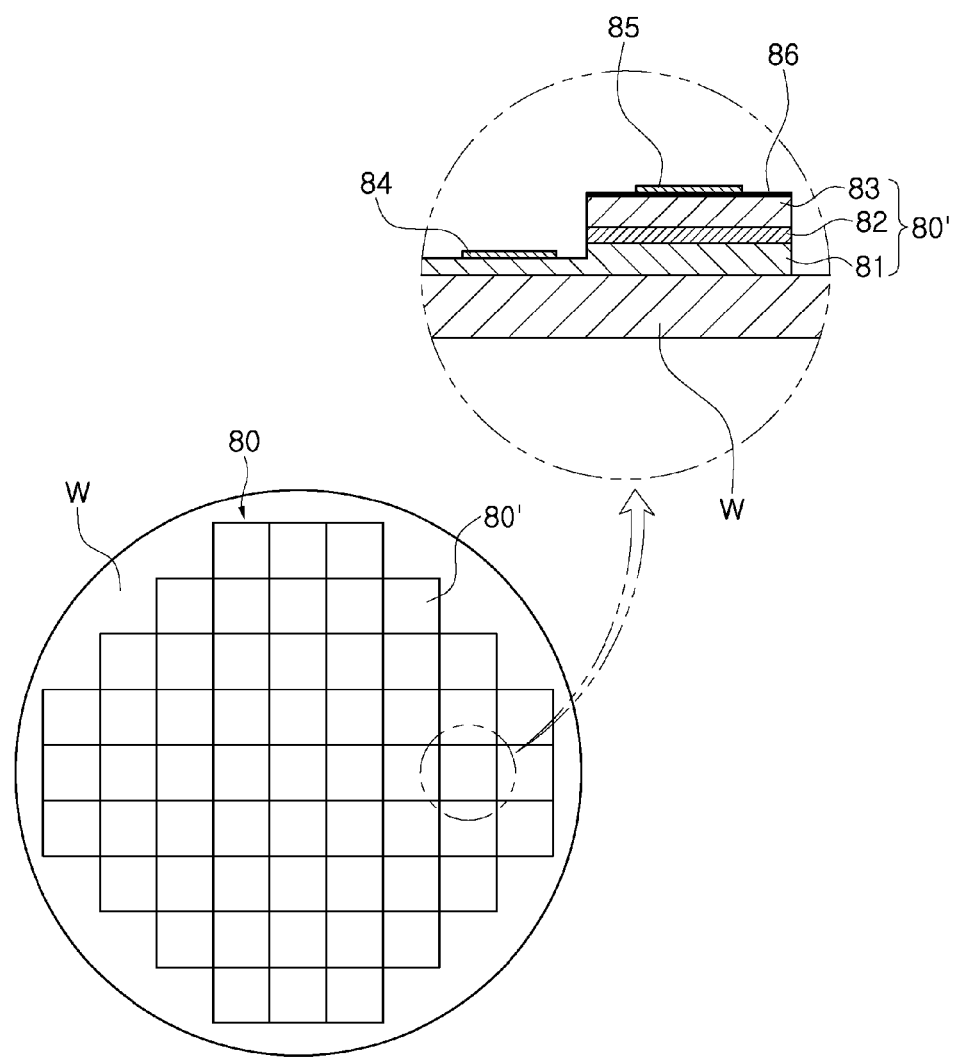
FIG. 7 is a detailed view of the structure of a light emitting structure that is configured of a superlattice structure shown in FIG. 6.

FIG. 6 is cross-sectional views illustrating a growth state of each thin film on a top surface of wafer, or a top surface and a bottom surface of the wafer shown in FIG. 5. FIG. 7 illustrates the structure of a light emitting structure that is configured of a superlattice structure shown in FIG. 6 in detail.

As shown in FIGS. 6 and 7, the superlattice structure 80 grown on the surfaces of the wafer W may include the light emitting structure 80' that includes a first conductive semiconductor layer 81, an active layer 82 and a second conductive semiconductor layer 83 which are formed in sequence. The light emitting structure 80' may be formed to further include a first electrode 84 and a second electrode 85 respectively formed on the first and second conductive semiconductor layers 81 and 83.

The first and second conductive semiconductor layers 81 and 83 may respectively be n-type and p-type semiconductor layers formed of a nitride semiconductor material. That is, according to the embodiment of the present invention, it could be understood that the first and second conductive semiconductor layers are respectively n-type and p-type layers.

The first conductive semiconductor layer 81 may be formed of a semiconductor material doped with a n-type impurity, based on a composition equation $Al_xIn_yGa_{(1-x-y)}N$ (herein, under the conditions of $0 \le x \le 1$, $0 \le y \le 1$, $0 \le x+y \le 1$). The semiconductor material may be GaN, AlGaN, InGaN, or the like. The impurity used for doping the first conductive semiconductor layer 81 may be Si, Ge, Se, Te, C, or the like.

The active layer 82 formed on the first conductive semiconductor layer 81 may be provided to emit light through a re-combination of electrons and electron holes therein. In general, an InGaN layer may be a quantum well layer, and an (Al) GaN layer may be a quantum barrier layer. These two layers may be disposed to alternate with each other to have a multiple quantum well structure MQW. For a blue light emitting diode, a multiple quantum well structure of InGaN/GaN or the like may be used, and for an ultraviolet light emitting diode, a multiple quantum well structure of GaN/AlGaN, InAlGaN/InAlGaN, InGaN/AlGaN and the like may be used. In order to improve the internal quantum efficiency in an of the active layer 82, a wavelength of light may be controlled by changing a composition ratio of In or Al, or the internal quantum efficiency of a light emitting structure may be improved by changing a depth of the quantum well layer within the active layer 82, the number of active layers, a thickness thereof, or the like.

The second conductive semiconductor layer 83 may be formed of a semiconductor material doped with a p-type impurity, based on a composition equation $Al_xIn_yGa_{(1-x-y)}N$ (herein, under the conditions of $0 \leq x \leq 1, 0 \leq y \leq 1, 0 \leq x+y \leq 1$) in the manner similar to the first conductive semiconductor layer 81. The semiconductor material may be GaN, AlGaN, InGaN, or the like. The impurity used for a doping of the second conductive semiconductor layer 83 may be Mg, Zn, Be, or the like.

The first and second electrodes 84 and 85, supplying a current, may be respectively formed on the first and second conductive semiconductor layers 81 and 83, such that the first and second electrodes may be respectively electrically connected to the first and second conductive semiconductor layers 81 and 83. Accordingly, light maybe emitted by allowing a current to flow through the first and second electrodes 84 and 85. In detail, the first electrode 84 may be formed on the first conductive semiconductor layer 81 that is mesa etched and of which a portion is exposed. Further, the second electrode 85 may be formed on a transparent electrode layer 86 that is formed on the second conductive semiconductor layer 83.

The first electrode 84 may be formed of a single layer or a plurality of layers formed of a material selected from a group consisting of Ti, Cr, Al, Cu and Au, on the first conductive semiconductor layer 81.

The second electrode 85 may be an outermost electrode layer to be mounted on a lead through wire bonding when later packaging a light emitting structure to manufacture a light emitting device package. The second electrode maybe generally formed of material such as Au or an alloy containing Au.

The transparent electrode layer 86 may be formed on almost an entire top surface of the second conductive semiconductor layer 83, and formed of a material having a good translucency in order to lower contact resistance with the second conductive semiconductor layer 83 having a relatively high energy band gap and simultaneously emit light generated in the active layer 82 toward an upper part.

The transparent electrode layer 86 may generally have a relatively high contact resistance, but in order to secure good translucency, the transparent electrode layer 86 may be formed of at one layer that is formed of an oxide selected from a group consisting of indium-zinc based oxide (ITO), indium oxide (IO), tin-based oxide ($SnO_2$), zinc-based oxide (ZnO) and indium-zinc based oxide (IZO). The transparent electrode layer 86 may be provided to improve efficiency in the reduction of operating voltage and an emission of light to the outside.

The present embodiment of the present invention describes that the first and second conductive semiconductor layers 81 and 83 constituting the light emitting structure are formed of a nitride semiconductor layer, but are not limited thereto, and for example, may also be formed of an oxide semiconductor layer.

The gas supplier according to another embodiment of the present invention will be described with reference to FIGS. 8 to 12.

Figure 8:
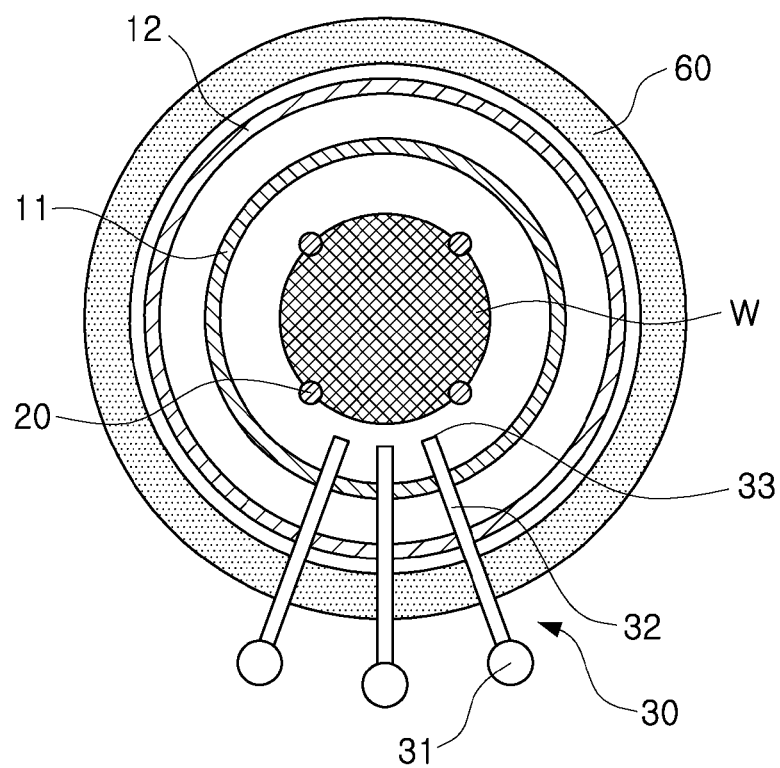
FIG. 8 is a plan view of a gas supplier according to another embodiment of the present invention.
Figure 9:
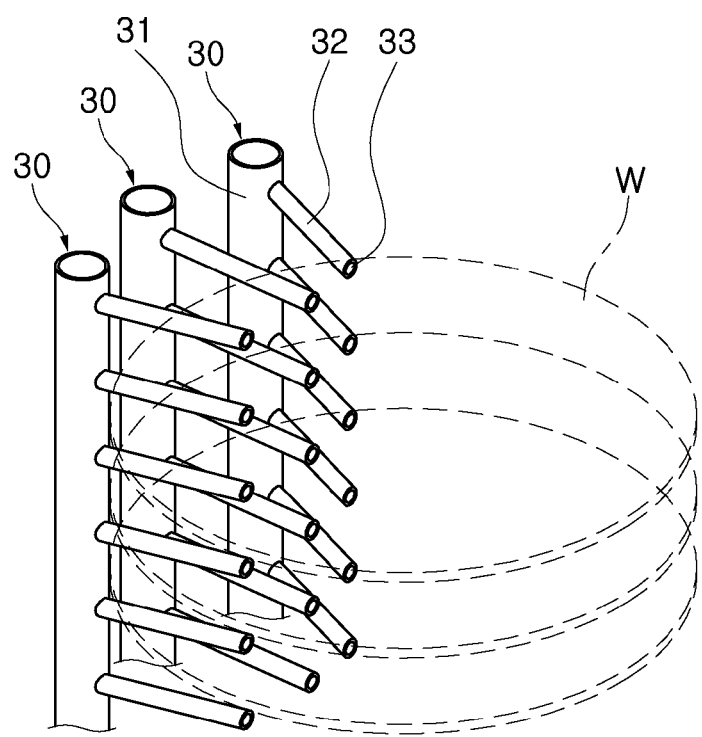
FIGS. 9 and 10 illustrate a gas supplier according to another embodiment of the present invention.
Figure 10:
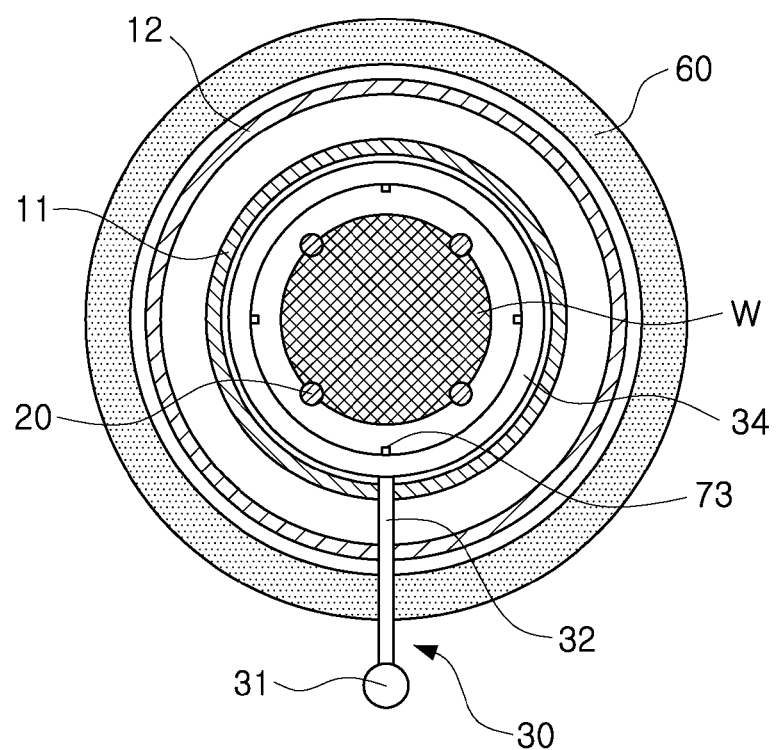
Figure 11:
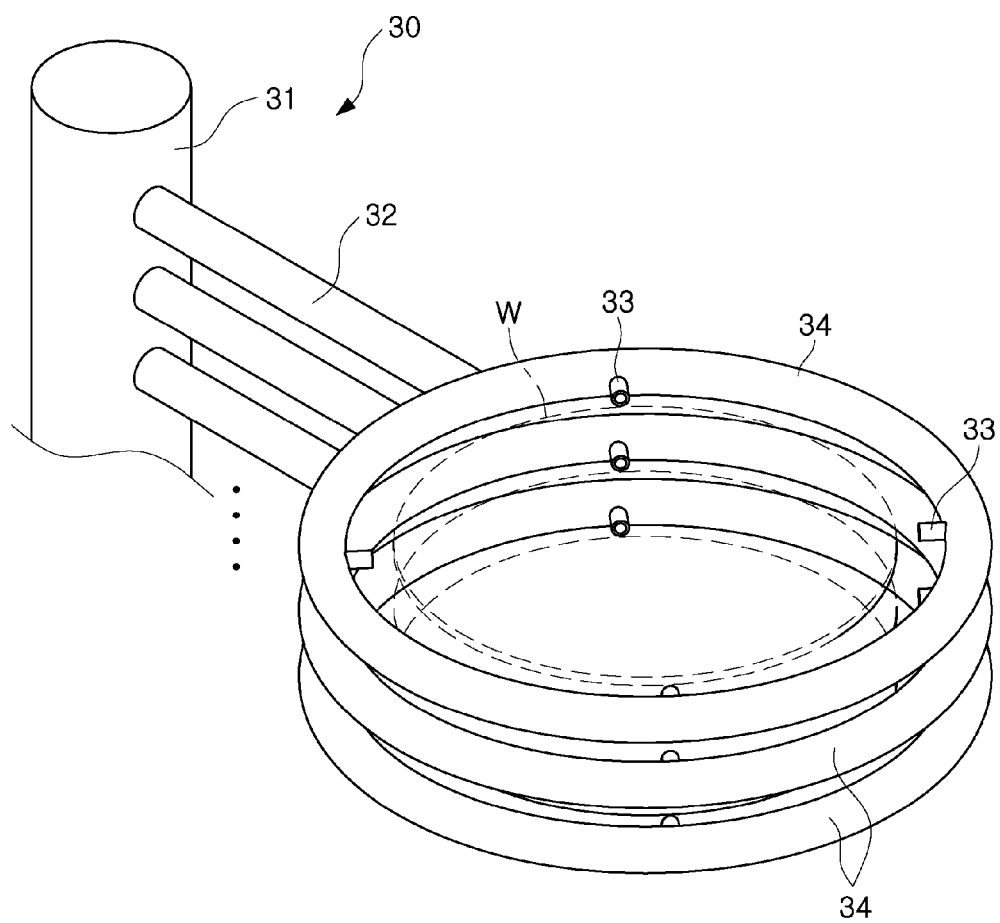
FIGS. 11 to 13 illustrate a gas supplier according to another embodiment of the present invention.
Figure 12:
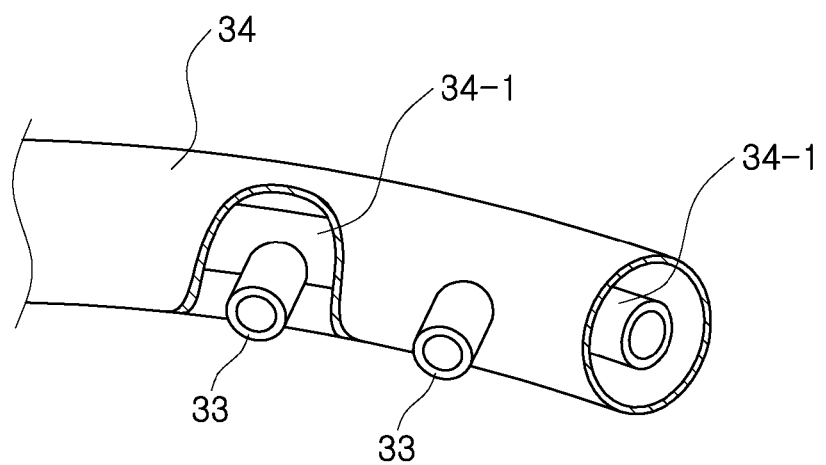

FIGS. 8 and 9 illustrate a gas supplier according to another embodiment of the present invention. FIGS. 10 to 12 illustrate a gas supplier according to another embodiment of the present invention.

As shown in FIG. 8, the gas supplier 30' may be configured to include a first stem pipe 31-1 supplying a first reactive gas and a second stem pipe 31-2 supplying a second reactive gas G2. In detail, unlike FIG. 2 illustrating a use of a single gas line 31, at least two stem pipes 31-1 and 31-2 may be disposed at the outside of the reaction chamber so as to supply the first and second reactive gases therethrough to be respectively distinguished. FIG. 8 illustrates two stem pipes 31-1 and 31-2, but is not limited thereto, for example, the number of gas lines may be increased according to the number of reactive gases.

FIGS. 8 and 9 illustrate a gas supplier according to another embodiment of the present invention.

As shown in FIGS. 8 and 9, at least one or more gas suppliers 30 may be used to supply the same reactive gas or different reactive gases to be respectively distinguished. Unlike FIG. 2 illustrating a use of a single gas supplier 30, at least two gas suppliers 30 may be used such that at least two stem pipes 31 are disposed at the outside of the reaction chamber and formed to vertically extend so as to correspond to a stacking direction of the wafers W. In this case, respective stem pipes 31 may supply different reactive gases to be distinguished from each other.

FIGS. 10 to 12 illustrate a gas supplier according to another embodiment of the present invention.

As shown in FIGS. 10 to 12, the gas supplier 30" may be configured to further include a ring shaped pipe 34. The ring shaped pipe 34 may be configured to be connected through the stem pipe 31 and the branch pipe 32 so as to spray the reactive gas G therethrough, and disposed along a circumference of each wafer W so as to surround the circumference of the wafer W and to be horizontal with the wafer W. In detail, the ring shaped pipe 34 may be formed to extend from the gas supplier side 30" to a direction able to surround the circumference of the wafer W at a position between the inner pipe 11 and the wafer holder 20, the gas supplier 30" being formed to vertically extend so as to correspond to the stacking direction of the wafers W.

The ring shaped pipe 34 may be formed to have a circular ring shape having a diameter larger than that of the wafer W. As shown in FIG. 12, the ring shaped pipe may be configured to include a first ring shaped pipe and a second ring shaped pipe in a multi-pipe structure such that the first and second reactive gases are supplied to be respectively distinguished through the respective first and second ring shaped pipes.

The ring shaped pipe 34 may be disposed between the wafer W and the wafer W which are stacked with each other, or the ring shaped pipes 34 may be arrayed to correspond to intervals between the stacked wafers W such that the arrayed ring shaped pipes may be disposed to be opposed to the circumferences of the respective wafers W.

A CVD apparatus according to another embodiment of the present invention will be described with reference to FIGS. 13 to 17.

Figure 13:
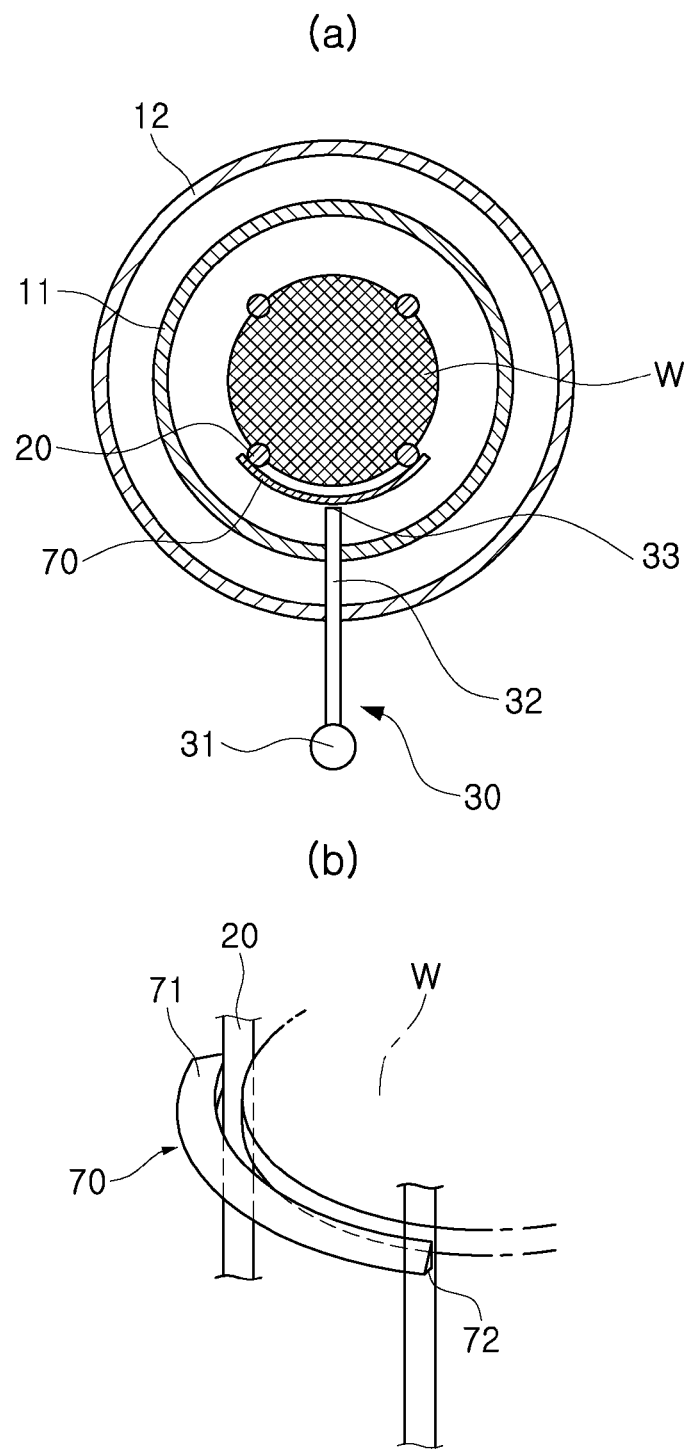
Figure 14:
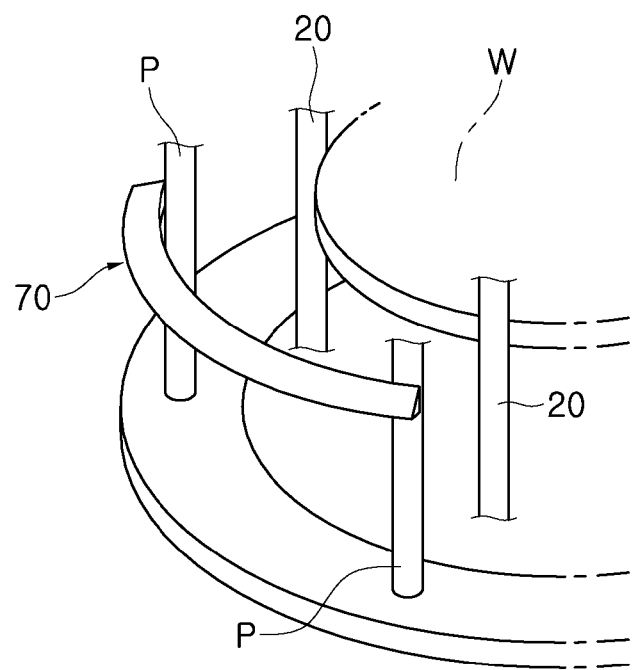
FIG. 14 is a schematic perspective view of a CVD apparatus according to another embodiment of the present invention.
Figure 15:
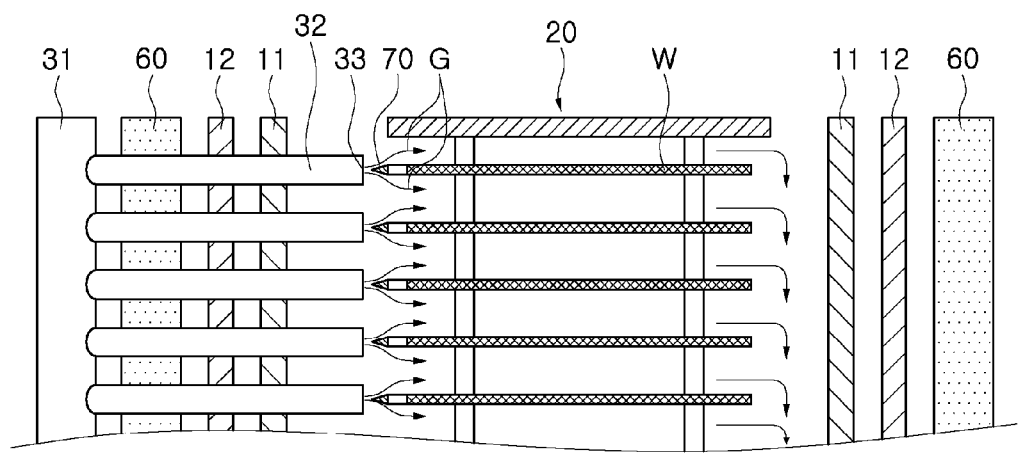
FIG. 15 is cross-sectional views of the CVD apparatus shown in FIG. 14.
Figure 15:
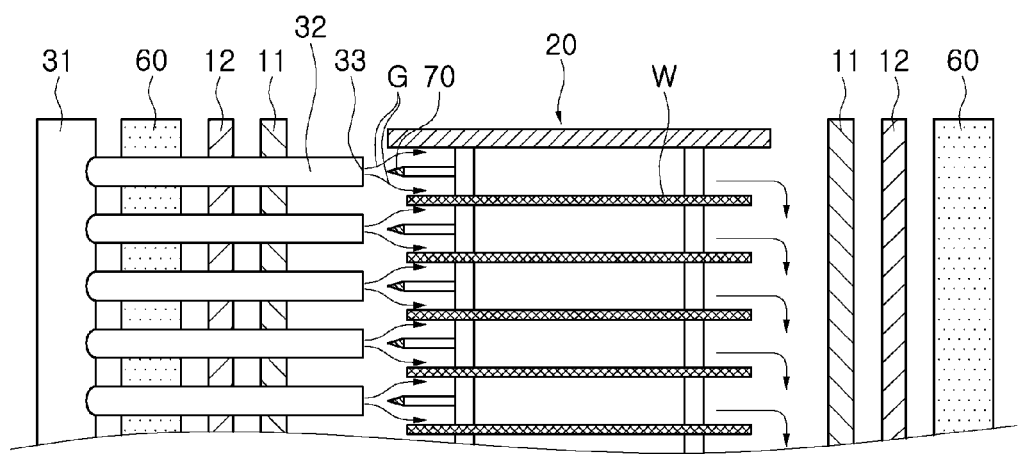
Figure 16:
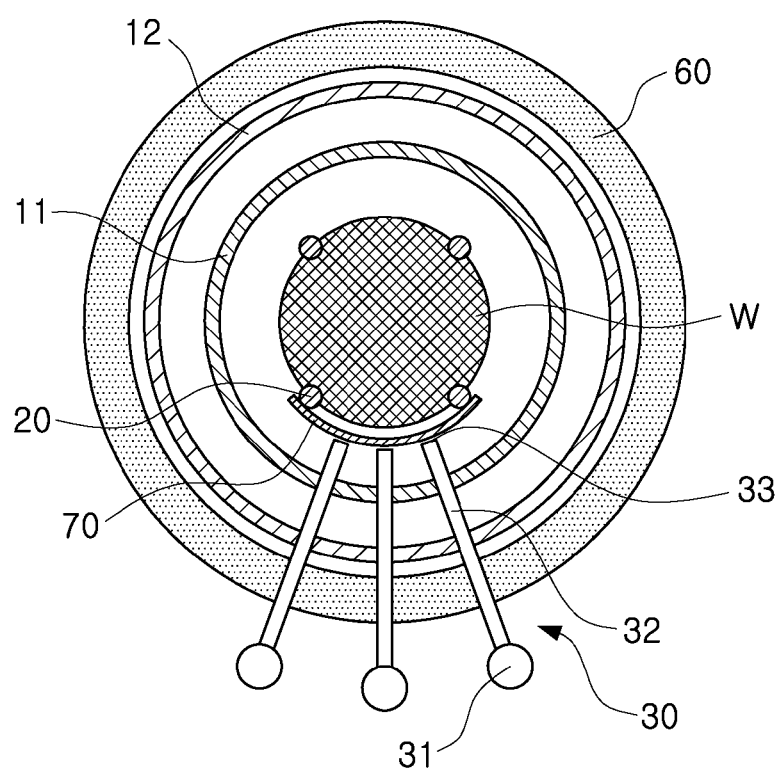
FIGS. 16 and 17 are plan views of a CVD apparatus according to another embodiment of the present invention.
Figure 17:
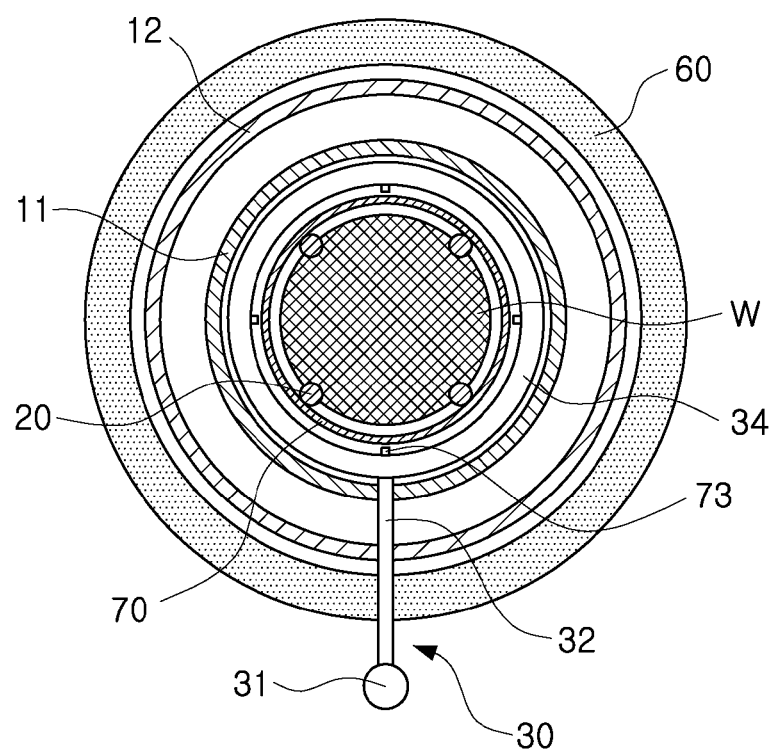

FIG. 13 illustrates a CVD apparatus according to another embodiment of the present invention. FIG. 14 is a schematic perspective view of a guide part shown in FIG. 13. FIG. 15 is a cross-sectional view of the CVD apparatus shown in FIG. 13. FIGS. 16 and 17 are plan views of a CVD apparatus according to another embodiment of the present invention.

In the case of the CVD apparatus according to the embodiment of the present invention referred to in FIG. 13, the basic structure thereof is substantially equal to the embodiment referred to in FIG. 1. Merely, as a difference between the embodiments of FIGS. 13 and 1, the embodiment of FIG. 13 shows a guide part 70 for guiding a flow of the reactive gas that is sprayed from a spray nozzle. Thus, the description of the same or like parts will be omitted, based on the description of the guide part 70.

As shown in FIG. 13, the guide part 70 may be provided to guide a flow of the reactive gas G such that the reactive gas G sprayed from the spray nozzles 33 is sprayed to and flows on top and bottom surfaces of each wafer W. Described in detail, the guide part 70 may be disposed between the spray nozzle 33 and the wafer W, and formed to include an upper sloped face 71 and a lower sloped face 72. The upper sloped face and the lower sloped face may be formed to respectively slope from the wafer W toward the spray nozzle 33 such that respective sections in the guide part are provided to be reduced in size, and may be formed to meet at an end point thereof. That is, as shown in FIG. 13, a section of the guide part may have a triangle shape, and the point at which the upper sloped face 71 and the lower sloped face 72 meet with each other may be configured to be directed toward the spray nozzle 33.

As shown in FIG. 13, in the case of the guide part 70, a plurality of guide parts 70 may be formed to respectively extend from the wafer holder 20 toward the spray nozzle 33, and may be vertically arrayed along the stacking direction of the wafers W. In detail, the guide part 70 may be configured to contact a circumferential surface of the wafer holder 20 so as to be provided singly, the wafer holder 20 being opposed to the gas supplier 30.

As shown in FIG. 14, the guide parts 70 maybe vertically arrayed along the stacking direction of the wafers W by using at least one pair of support pins P, and may be configured to be separable from the wafer holder 20 and to be opposed to the spray nozzles 33.

The guide part 70 may be disposed to correspond to a layout structure of the spray nozzles 33 spraying the reactive gas G. That is, as shown in FIG. 15A, in a case in which the plurality of spray nozzles 33 are arrayed to be opposed to the side part of the stacked wafers W, the guide parts 70 may be vertically arrayed to correspond to intervals between the stacked wafers W such that a vertex, a front part of the guide part 70, is opposed to the spray nozzle 33 and a back part thereof is opposed to each side part of the stacked wafers W.

In addition, as shown in FIG. 15B, in a case in which the plurality of spray nozzles 33 are arrayed to be located between the wafer W and the wafer W which are stacked with each other, the guide parts 70 may be vertically arrayed to correspond to intervals between the stacked wafers W such that an array interval between the guide parts is formed to correspond to a gap between the stacked wafers W. Therefore, the guide part 70 may guide a flow direction of the reactive gas G sprayed from the spray nozzles 33 such that the reactive gas G flows on top and bottom surfaces of each wafer W, thereby allowing the superlattice structure 80 to be grown on both surfaces, the top and bottom surfaces of each wafer W.

As shown in FIG. 17, when the gas supplier 30" is configured to include the ring shaped pipe 34, the guide parts 70 may be disposed around the circumference of the wafers W to have a circular ring shape between the ring shaped pipe 34 and the wafer holder 20. In other words, the guide part 70 may be provided to have a circular ring shape having a diameter that is larger than that of the wafer W and smaller than the ring shaped pipe 34.

According to an embodiment of the present invention, a method of forming a semiconductor superlattice structure using a CVD apparatus will be described below. The description below is provided with reference to the CVD apparatus shown in FIGS. 1 to 17.

First, a plurality of wafers W may be stacked to be spaced apart from one another in the wafer holder 20, and the wafer holder 20 may be disposed within the inner pipe 11 of the reaction chamber 10 that is provided together with the gas supplier 30. The wafer holder 20 may be disposed within the inner pipe 11 or discharged therefrom by using a base plate 13, the base plate 13 being disposed at a lower part of the inner pipe 11 and configured to open or close the inner pipe 11 and to be separable therefrom.

In this case, the guide part 70 may be additionally configured to be disposed between the gas supplier 30 and the wafer holder 20 so as to guide a flow of the reactive gas sprayed from the gas supplier.

The guide part 70 may be formed to include an upper sloped face 71 and a lower sloped face 72. The upper sloped face and the lower sloped face may be formed to respectively tilt from the wafer W toward the gas supplier 30 such that respective sections in the guide part are provided to be reduced in size, and may be formed to meet at an end point thereof. The guide parts 70 may be vertically arrayed to correspond to intervals between the stacked wafers W such that the arrayed guide parts are positioned to be opposed to the respective side parts of the stacked wafers W or to be opposed to the space between the wafer W and the wafer W stacked with each other. The detailed description of the guide part 70 on the layout structure thereof has been provided above relating to the above-mentioned CVD apparatus 1, and thus a description of the present embodiment will be omitted.

The heater may be configured to be separable and may be disposed at the outside of the reaction chamber, and may heat the reaction chamber. The heater may be formed as a heater jacket to have a jacket shape to be able to be fastened to or separated from the reaction chamber by being inserted into the insertion hole thereof and vice versa. Subsequently, the reactive gas G from the outside may be sprayed to the wafers W through the gas supplier 30.

The gas supplier 30 may include at least one stem pipe 31 formed to vertically extend so as to correspond to a stacking direction of the wafers W at the outside of the reaction chamber, such that the reactive gas G is introduced from the outside of the reaction chamber into the reaction chamber; a branch pipe 32 connected to the stem pipe to introduce the reactive gas from the outside of the reaction chamber to the inside of the reaction chamber; and a plurality of spray nozzles 33 connected through the stem pipe, provided at an end part of the branch pipe to spray the reactive gas to the plurality of respective wafers W. Herein, the plurality of spray nozzles 33 may be arrayed to correspond to intervals between the stacked wafers W so as to be opposed to the circumferences of the stacked wafers W or to be located between the wafer W and the wafer W stacked with each other. The gas supplier may be provided a singly or plurally so as to supply the same reactive gas g or different reactive gases G to be respectively distinguished.

Subsequently, the reactive gas G sprayed from the gas supplier 30 may flow along the surfaces of the respective wafers W, the top and bottom surfaces of the respective wafers W, thereby allowing the semiconductor superlattice structure 80 to be grown on the surfaces of the respective wafers W. Herein, the semiconductor superlattice structure 80 grown on the surfaces of the wafer W may form the light emitting structure 80' that includes the first conductive semiconductor layer 81, the active layer 82 and the second conductive semiconductor layer 83 which grow in sequence. In addition, the first and second electrodes 84 and 85 may be respectively formed on the first and second conductive semiconductor layers 81 and 83 such that the first and second electrodes are electrically connected to the first and second conductive semiconductor layers 81 and 83, respectively. This light emitting structure may be later singulated into individual elements through a dicing process, and then, these elements may be manufactured as a plurality of light emitting device chips.

As described above, in the case of the CVD apparatus 1 according to an embodiment of the present invention, spray nozzles 33 may be configured to correspond to hundreds of wafers stacked in the wafer holder 20, respectively, to spray the reactive gas G, thereby allowing the semiconductor superlattice structure 80 to be grown on the surfaces of the respective wafers W.

In addition, the CVD apparatus according to the embodiment of the present invention may further include the guide parts 70 disposed to be respectively opposed to the spray nozzles 33 so as to guide a flow direction of the reactive gas G such that the reactive gas G sprayed from the spray nozzles 33 flows on top and bottom surfaces of each wafer W, thereby allowing the superlattice structure 80 to be grown on the top and bottom surfaces of the wafer W. Accordingly, the mass production of devices having the semiconductor superlattice structure described above according to the embodiment of the present invention may be attained, thereby improving productivity. In particular, according to the embodiment of the present invention, the superlattice structure maybe grown on both surfaces of a wafer so as to relieve stress, even in the case that large-diameter wafers are used, thereby performing the processes with consideration of quality without a bowing effect.

As set forth above, according to an embodiment of the present invention, a gas supplier for use in a CVD apparatus may be prevented from being blocked in the inside thereof due to a deposition of a reactive gas.

In addition, a gas supplier may be provided singly, whereby a CVD apparatus improved in a vacuum and mechanical stability may be achieved.

While the present invention has been shown and described in connection with the exemplary embodiments, it will be apparent to those skilled in the art that modifications and variations can be made without departing from the spirit and scope of the invention as defined by the appended claims.

What is claimed is:

1. A chemical vapor deposition (CVD) apparatus, comprising:
   a reaction chamber including an inner pipe having an internal space, and an external pipe configured to cover the inner pipe so as to maintain a sealing state thereof;
   a wafer holder disposed within the inner pipe and receiving a plurality of wafers stacked therein;
   a heater disposed at the outside of and separate from the reaction chamber therefrom, the heater being configured for heating the reaction chamber; and
   a gas supplier including at least one stem pipe disposed at the outside of the reaction chamber so as to supply a reactive gas, a plurality of branch pipes connected to the at least one stem pipe and extending through the heater and configured to introduce the reactive gas from the outside of the reaction chamber into the reaction chamber through the heater, and a plurality of spray nozzles provided with the branch pipes to spray the reactive gas to the plurality of respective wafers.

2. The apparatus of claim 1, wherein the heater is configured to have an insertion hole and a fastening aperture, through which the plurality of branch pipes are inserted into the reaction chamber from the outside, the heater being configured to be fastened to or separated from the reaction chamber by being inserted into the insertion hole thereof and vice versa.

3. The apparatus of claim 1, wherein the stem pipe is configured to extend vertically so as to correspond to a position at which the respective wafers are disposed.

4. The apparatus of claim 1, wherein the plurality of spray nozzles are arrayed to correspond to intervals between the stacked wafers.

5. The apparatus of claim 1, wherein the plurality of spray nozzles are arrayed to be located between the stacked wafers.

6. The apparatus of claim 1, wherein the gas supplier includes a plurality of stem pipes supplying different reactive gases.

7. The apparatus of claim 1, wherein the gas supplier further includes a ring shaped pipe, the ring shaped pipe being connected through the stem pipe, formed to have a circular ring shape having a diameter larger than that of the wafer so as to surround a circumference of the wafer, and being configured to have a plurality of spray nozzles disposed in a circumferential part of the circular ring shape.

8. The apparatus of claim 7, wherein the ring shaped pipe is configured to have a multi-pipe structure such that different reactive gases are supplied to the wafers therethrough.

9. The apparatus of claim 1, further comprising a guide part provided to guide a flow of the reactive gas such that the reactive gas sprayed from the spray nozzles is sprayed to and flows on top and bottom surfaces of each wafer.

10. The apparatus of claim 9, wherein the guide part is disposed between the spray nozzle and the wafer and configured to include an upper sloped face and a lower slope face, the upper sloped face and the lower sloped face being formed to respectively slope from the wafer toward the spray nozzle such that respective sections in the guide part are provided to be reduced in the size thereof, and being formed to meet at an end point thereof.

11. The apparatus of claim 9, wherein the guide parts are vertically arrayed along the stacking direction of the wafers and arrayed to correspond to intervals between the stacked wafers so as to be opposed to each side part of the stacked wafers.

12. The apparatus of claim 9, wherein the guide parts are vertically arrayed to correspond to intervals between the stacked wafers so as to be opposed to a gap between the stacked wafers.

13. The apparatus of claim 9, wherein the guide parts are formed to extend from the wafer holder toward the spray nozzles and vertically arrayed along the stacking direction of the wafers.

14. A chemical vapor deposition (CVD) apparatus, comprising:
   a reaction chamber including an inner pipe having an internal space, and an external pipe configured to cover the inner pipe so as to maintain a sealing state thereof;
   a wafer holder disposed within the inner pipe and receiving a plurality of wafers stacked therein; and
   a gas supplier including at least one stem pipe disposed at the outside of the reaction chamber so as to supply a reactive gas, a plurality of branch pipes connected to the stem pipe to introduce the reactive gas from the outside of the reaction chamber into the reaction chamber, and a plurality of spray nozzles provided with the branch pipes to spray the reactive gas to the plurality of respective wafers, wherein the gas supplier further includes a ring shaped pipe, the ring shaped pipe being connected through the stem pipe, formed to have a circular ring shape having a diameter larger than that of the wafer so as to surround a circumference of the wafer, and being configured to have a plurality of spray nozzles disposed in a circumferential part of the circular ring shape.

* * * * *